United States Patent
Watanabe et al.

(10) Patent No.: US 12,160,217 B2
(45) Date of Patent: Dec. 3, 2024

(54) HIGH FREQUENCY FILTER

(71) Applicant: Mitsubishi Electric Corporation, Tokyo (JP)

(72) Inventors: Motomi Watanabe, Tokyo (JP); Yukihiro Homma, Tokyo (JP); Tomohiro Takahashi, Tokyo (JP); Shinji Arai, Tokyo (JP); Kenji Harauchi, Tokyo (JP); Hidenori Yukawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 183 days.

(21) Appl. No.: 17/880,209

(22) Filed: Aug. 3, 2022

(65) Prior Publication Data

US 2022/0407489 A1   Dec. 22, 2022

Related U.S. Application Data

(63) Continuation of application No. PCT/JP2020/013533, filed on Mar. 26, 2020.

(51) Int. Cl.
| | | |
|---|---|---|
| *H03H 7/075* | (2006.01) | |
| *H01P 3/08* | (2006.01) | |
| *H05K 1/02* | (2006.01) | |
| *H05K 1/11* | (2006.01) | |
| *H05K 3/34* | (2006.01) | |
| *H05K 3/46* | (2006.01) | |

(52) U.S. Cl.
CPC ............. *H03H 7/075* (2013.01); *H01P 3/08* (2013.01); *H05K 1/0251* (2013.01); *H05K 1/116* (2013.01);
(Continued)

(58) Field of Classification Search
CPC ............ H03H 7/075; H03H 7/00; H03H 7/01; H03H 7/0107; H05K 3/46; H05K 1/116;
(Continued)

(56) References Cited

U.S. PATENT DOCUMENTS

| | | | | |
|---|---|---|---|---|
| 7,705,695 B2* | 4/2010 | Kushta | ................. | H01P 1/2039 |
| | | | | 333/204 |
| 8,492,658 B2* | 7/2013 | Gruendler | ............. | H05K 1/162 |
| | | | | 174/262 |

(Continued)

FOREIGN PATENT DOCUMENTS

| | | |
|---|---|---|
| JP | 2004-521536 A | 7/2004 |
| JP | 2007-158675 A | 6/2007 |
| JP | 2008-507858 A | 3/2008 |

OTHER PUBLICATIONS

Hong, Jia-Sheng, "Microstrip Filters For RF/Microwave Applications," Second Edition, John Wiley & Sons, Inc., Hoboken, New Jersey, 2011, pp. 112-113.
International Search Report (PCT/ISA/210) issued in PCT/JP2020/013533, dated Jun. 16, 2020.
(Continued)

*Primary Examiner* — Hai L Nguyen
(74) *Attorney, Agent, or Firm* — BIRCH, STEWART, KOLASCH & BIRCH, LLP (57) ABSTRACT

A high frequency filter includes: a multilayer substrate including a first substrate for which lands are provided, a second substrate for which lands are provided, and a third substrate for which lands are provided, the third substrate being sandwiched between the first substrate and the second substrate; a columnar conductor electrically connected to the lands in the multilayer substrate; and columnar conductors provided to surround the columnar conductor, electrically connected to a ground plane of the first substrate, and electrically connected to a ground plane of the second substrate. The spacing between the lands of the first substrate and the lands of the third substrate and the spacing between the lands of the second substrate and the lands of the third substrate are electrical lengths of 90 degrees or less at the cutoff frequency.

7 Claims, 9 Drawing Sheets

(52) U.S. Cl.
CPC ................. *H05K 3/34* (2013.01); *H05K 3/46*
(2013.01); *H05K 2201/09372* (2013.01)

(58) Field of Classification Search
CPC ....... H05K 1/0222; H05K 2201/09372; H05K
2201/09481; H05K 2201/1031; H05K
2201/09454; H01P 1/202; H01P 1/203
USPC .......... 333/33, 167, 172, 202, 206, 243, 246
See application file for complete search history.

(56) References Cited

U.S. PATENT DOCUMENTS

| | | |
|---|---|---|
| 2001/0054938 A1 | 12/2001 | Miller |
| 2002/0130737 A1 | 9/2002 | Hreish et al. |
| 2003/0080835 A1 | 5/2003 | Hreish et al. |
| 2008/0093112 A1 | 4/2008 | Kushta |

OTHER PUBLICATIONS

Kobayashi et al., "Microwave Dielectric Filters," The Insitute of Electronics, Information & Communication Engineers and Corona Inc., Mar. 30, 2007, pp. 120-123 (especially pp. 120-121), total 5 pages.

Kuraishi, Genzaburo, "Detailed Explanation, Example Exercises, Microwave Circuits," 1st Edition, Tokyo Denki University Press, Mar. 30, 1983, pp. 9-10 (total 5 pages).

* cited by examiner

| Land | Size (mm) | Opening | Size (mm) |
|---|---|---|---|
| Land 41a | 1.50 | Opening 411a | 2.50 |
| Land 41b | 3.30 | Opening 411b | 5.70 |
| Land 41c | 1.50 | Opening 411c | 5.70 |
| Land 61a | 1.50 | Opening 611a | 5.70 |
| Land 61b | 4.30 | Opening 611b | 5.70 |
| Land 61c | 3.15 | Opening 611c | 5.70 |
| Land 61d | 1.50 | Opening 611d | 2.50 |
| Land 51a | 1.50 | Opening 511a | 5.70 |
| Land 51b | 3.10 | Opening 511b | 5.70 |
| Land 51c | 1.50 | Opening 511c | 2.50 |
| Land 51d | 1.50 | Opening 511d | 5.70 |
| Land 51e | 1.50 | Opening 511e | 5.70 |

FIG. 11B

| Combination of Lands | Spacing between Lands (mm) |
|---|---|
| Spacing between Lands 41a and 41b | 0.200 |
| Spacing between Lands 41b and 41c | 0.200 |
| Spacing between Lands 41c and 61a | 2.000 |
| Spacing between Lands 61a and 61b | 0.100 |
| Spacing between Lands 61b and 61c | 0.125 |
| Spacing between Lands 61c and 61d | 0.100 |
| Spacing between Lands 61d and 51a | 2.000 |
| Spacing between Lands 51a and 51b | 0.200 |
| Spacing between Lands 51b and 51c | 0.200 |
| Spacing between Lands 51c and 51d | 0.115 |
| Spacing between Lands 51d and 51e | 0.200 |

HIGH FREQUENCY FILTER

CROSS REFERENCE TO RELATED APPLICATIONS

This application is a Continuation of PCT International Application No. PCT/JP2020/013533, filed on Mar. 26, 2020, which is hereby expressly incorporated by reference into the present application.

TECHNICAL FIELD

The present disclosure relates to a high frequency filter.

BACKGROUND ART

High frequency filters are plane filters to be mounted in high frequency circuits. For example, a high frequency printed circuit board (PCB) via described in Patent Literature 1 includes a perpendicular conductor extending perpendicularly between microstrip conductors or strip conductors formed in individual layers of a PCB, and electric conduction pads which surround this perpendicular conductor and are provided in an inner layer of the PCB. The PCB including this via functions as a high frequency filter because the electric conduction pads function as capacitive elements and the perpendicular conductor functions as an inductive element.

CITATION LIST

Patent Literature

Patent Literature 1: Japanese Unexamined Patent Application Publication (Translation of PCT Application) No. 2004-521536

SUMMARY OF INVENTION

Technical Problem

A problem with the high frequency filter described in Patent Literature 1 is that unnecessary harmonic components occurring in a high frequency band higher than the passing frequency cannot be suppressed because of the distortion characteristic of an amplifier included in a high frequency circuit.

The present disclosure is made to solve the above-mentioned problem, and it is therefore an object of the present disclosure to obtain a high frequency filter that can form a stopband in the frequency band of unnecessary harmonic components.

Solution to Problem

According to the present disclosure, there is provided a high frequency filter including: a multilayer substrate including a first multilayered substrate for which a first electric conduction pad including multiple lands formed along a layering direction of the multilayer substrate is provided, the multiple lands forming a capacitance, a second multilayered substrate for which a second electric conduction pad including multiple lands formed along the layering direction is provided, the multiple lands forming a capacitance, and a third multilayered substrate for which a third electric conduction pad including multiple lands formed along the layering direction is provided, the multiple lands forming a capacitance, the third substrate being sandwiched between the first substrate and the second substrate; a first columnar conductor provided in such a way as to penetrate the multilayer substrate, and electrically connected to the first electric conduction pad, the second electric conduction pad and the third electric conduction pad, a signal being input to and output from the first columnar conductor via both ends of the multilayer substrate in the layering direction; and multiple second columnar conductors provided in such a way as to penetrate the multilayer substrate and to surround the first columnar conductor, electrically connected to a ground plane provided on a first main surface of the first substrate, the first main surface being opposite to a second main surface facing the third substrate, and electrically connected to a ground plane provided on a first main surface of the second substrate, the first main surface being opposite to a second main surface facing the third substrate, in which the first columnar conductor and the second columnar conductors constitute a coaxial line in which the first columnar conductor functions as an inner conductor and the second columnar conductors function as an outer conductor, and in the first columnar conductor, a portion corresponding to the spacing between the first electric conduction pad and the third electric conduction pad and a portion corresponding to the spacing between the second electric conduction pad and the third electric conduction pad are electrical lengths of 90 degrees or less at the center frequency of a stopband where transmission of a signal is rejected.

Advantageous Effects of Invention

According to the present disclosure, the multilayer substrate includes the first substrate for which the first electric conduction pad is provided, the second substrate for which the second electric conduction pad is provided, and the third substrate for which the third electric conduction pad is provided, the third substrate being sandwiched between the first substrate and the second substrate, and, in the multilayer substrate, the first columnar conductor electrically connected to the first electric conduction pad, the second electric conduction pad and the third electric conduction pad, and the multiple second columnar conductors provided in such a way as to surround the first columnar conductor, electrically connected to the ground plane of the first substrate, and electrically connected to the ground plane of the second substrate are provided. The spacing between the first electric conduction pad and the third electric conduction pad and the spacing between the second electric conduction pad and the third electric conduction pad are the electrical lengths of 90 degrees or less at the center frequency of the stopband where the transmission of signal is rejected. As a result, the high frequency filter according to the present disclosure can form the stopband in the frequency band of unnecessary harmonic components.

DESCRIPTION OF EMBODIMENTS

Embodiment 1

Figure 1:
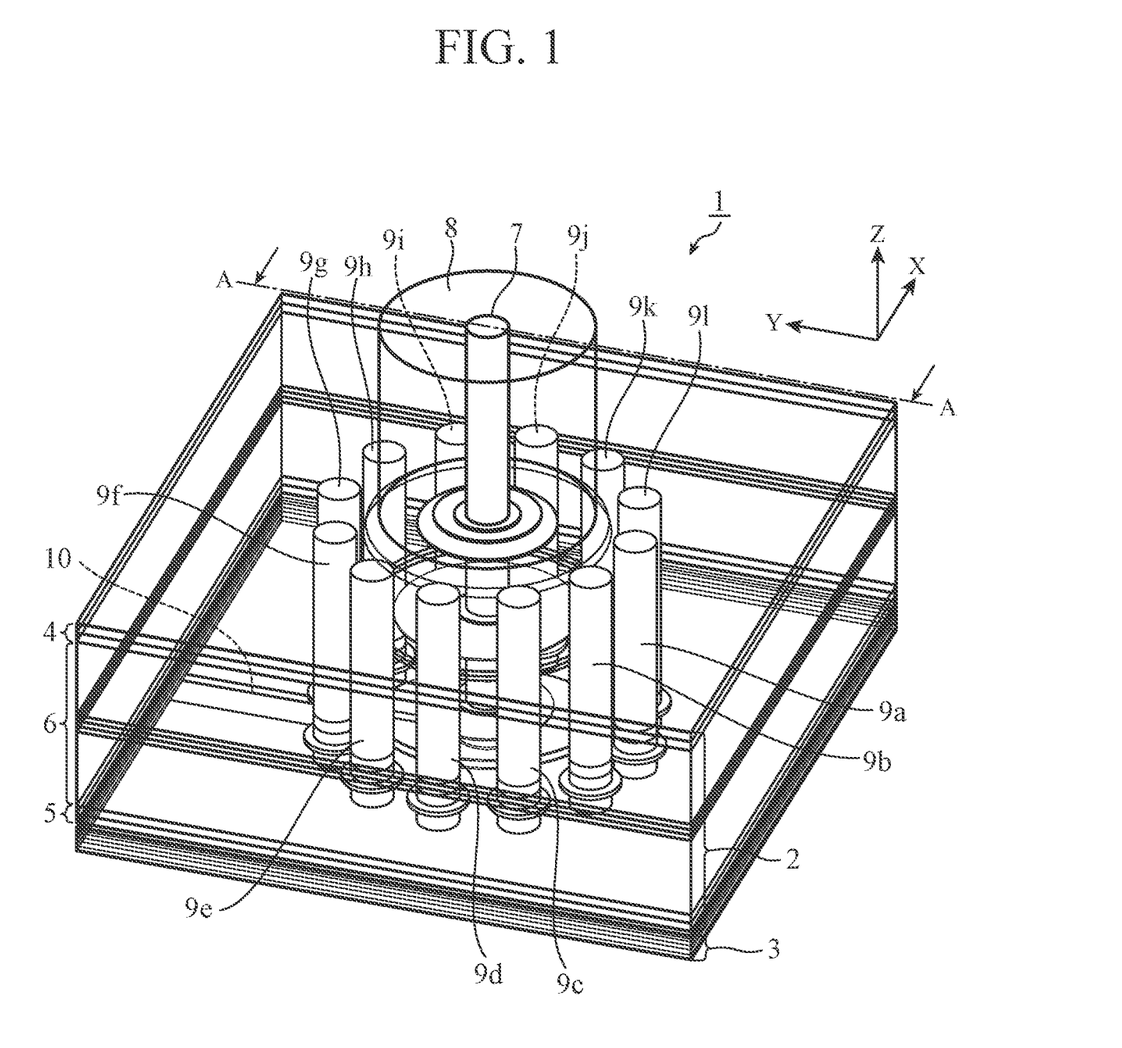
FIG. 1 is a perspective view showing a high frequency filter according to Embodiment 1.
Figure 2:
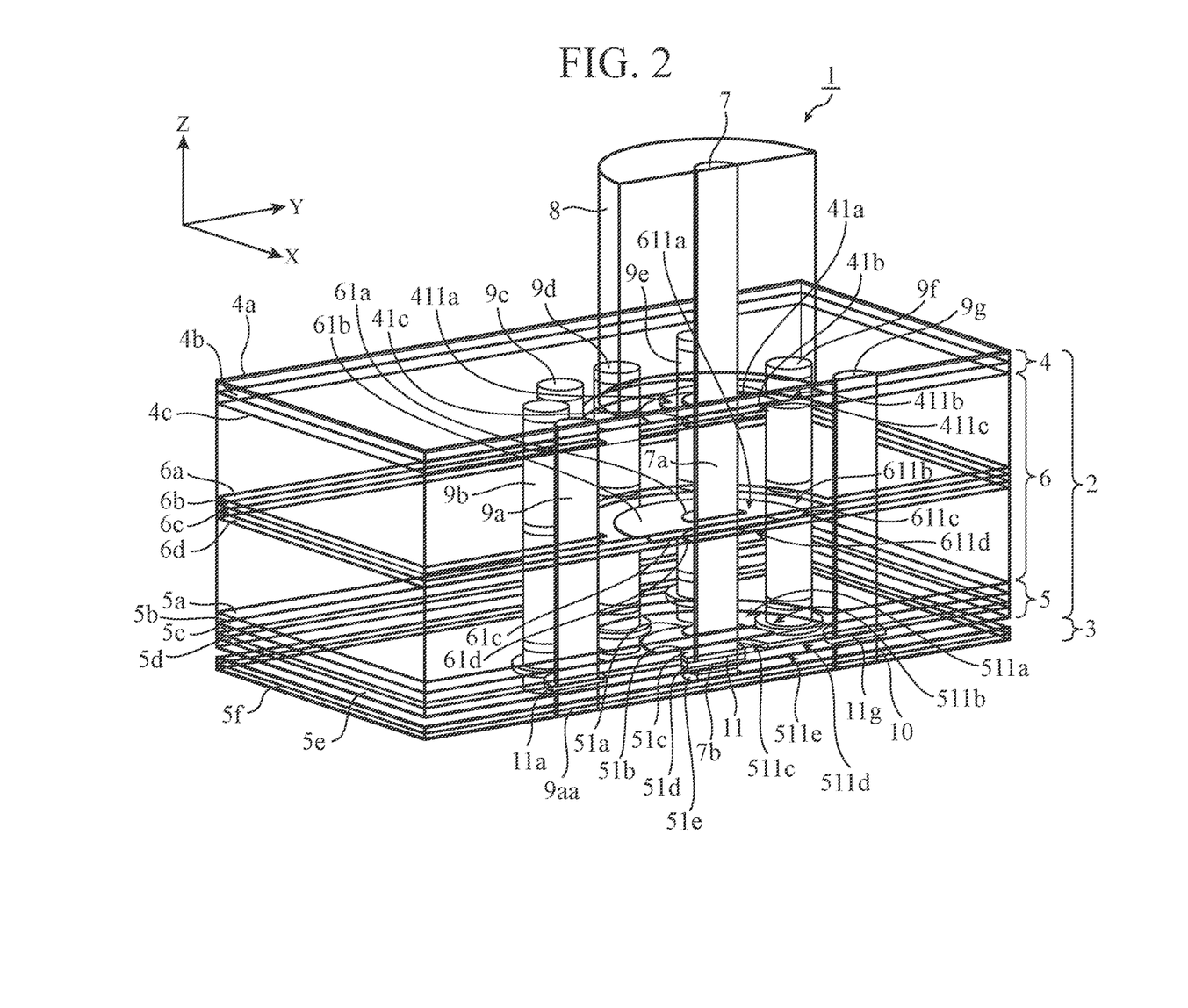
FIG. 2 is a cross-sectional perspective view showing a cross section of the high frequency filter according to Embodiment 1, taken along the A-A line of FIG. 1.
Figure 3:
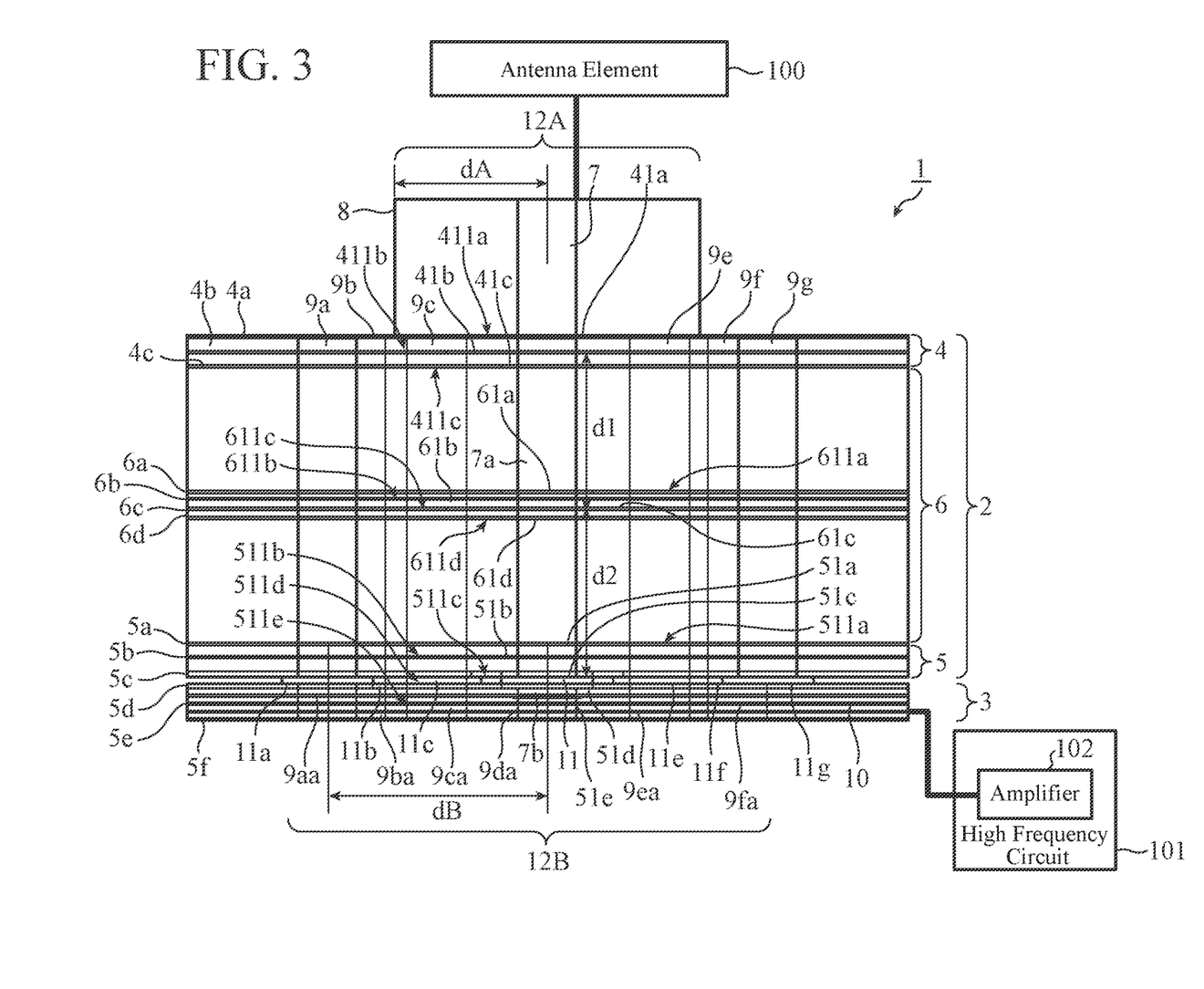
FIG. 3 is a cross-sectional view showing the high frequency filter of FIG. 2 when viewed from a negative X direction.
Figure 4:
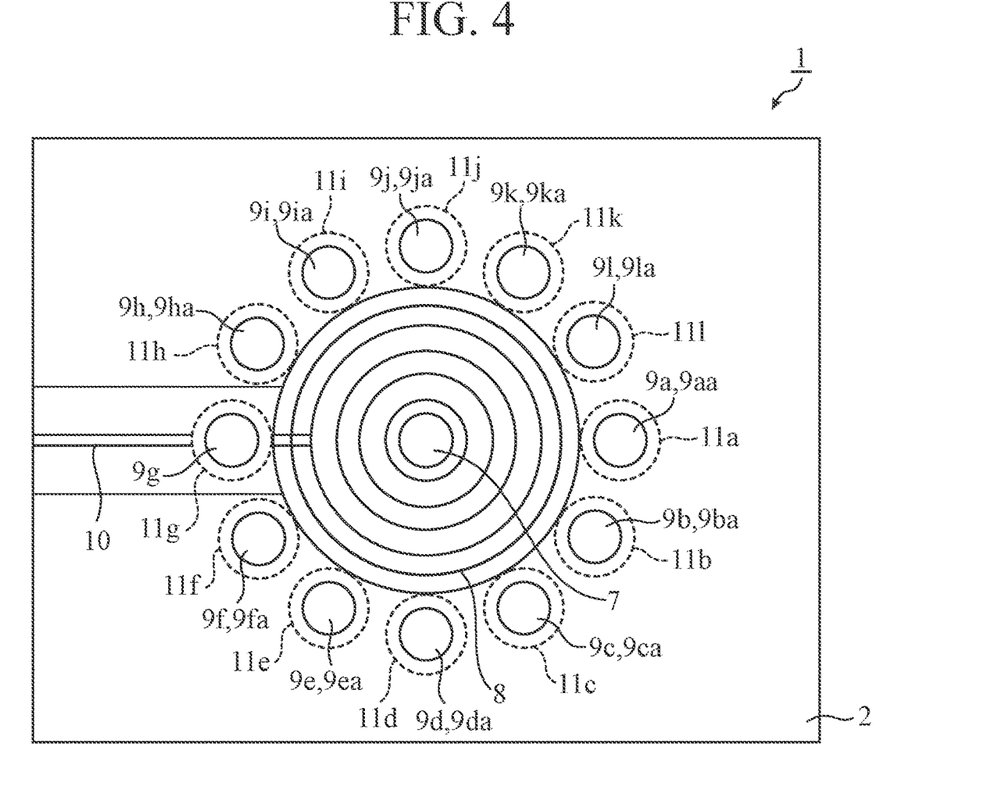
FIG. 4 is a plane view showing the high frequency filter of FIG. 1 when viewed from a negative Z direction.

FIG. 1 is a perspective view showing a high frequency filter 1 according to Embodiment 1. FIG. 2 is a cross-sectional perspective view showing a cross section of the high frequency filter 1 taken along the A-A line of FIG. 1. FIG. 3 is a cross-sectional view showing the high frequency filter 1 of FIG. 2 when viewed from a negative X direction. FIG. 4 is a plane view showing the high frequency filter 1 of FIG. 1 when viewed from a negative Z direction. In FIGS. 1, 2, 3 and 4, the structures of the inner layers of a multilayer substrate 2 and a multilayer substrate 3 are shown in such a way as to be seen through. The high frequency filter 1 includes the multilayer substrate 2 and the multilayer substrate 3. The multilayer substrate 2 is a multilayered dielectric substrate including a first substrate 4, a second substrate 5 and a third substrate 6. The multilayer substrate 3 is a multilayered dielectric substrate.

In the first substrate 4, a ground plane 4a is provided for an uppermost surface, a ground plane 4b is provided for an inner layer, and a ground plane 4c is provided for a lowermost surface. In the second substrate 5, a ground plane 5a is provided for an uppermost surface, a ground plane 5b is provided for an inner layer, and a ground plane 5c is provided for a lowermost surface. The third substrate 6 is sandwiched between the first substrate 4 and the second substrate 5, and, in its inner layer, a ground plane 6a, a ground plane 6b, a ground plane 6c and a ground plane 6d are provided in order along a direction from an upper layer toward a lower layer.

A ground plane 5d is provided for a first main surface (uppermost surface) of the multilayer substrate 3, the first main surface facing the multilayer substrate 2, a ground plane 5e is provided for the inner layer of the multilayer substrate 3, and a ground plane 5f is provided for a second main surface (lowermost surface) of the multilayer substrate 3, the second main surface being opposite to the first main surface facing the multilayer substrate 2.

A columnar conductor 7 is a first columnar conductor provided in such a way as to penetrate the multilayer substrate 2. In the columnar conductor 7, a portion located in the inner layer of the multilayer substrate 2 is a columnar conductor portion 7a. An end portion of the columnar conductor 7 projecting from an uppermost surface of the multilayer substrate 2 is enclosed by an outer conductor 8, and is, for example, electrically connected to an antenna element 100, as shown in FIG. 3. The outer conductor 8 may be a tubular conductor wall, as shown in FIG. 4, or may be a columnar conductor having a penetrating hole through which the columnar conductor 7 can pass without touching the inner peripheral surface of the penetrating hole. The outer conductor 8 is electrically connected to the ground plane 4a.

A columnar conductor 9a, a columnar conductor 9b, a columnar conductor 9c, a columnar conductor 9d, a columnar conductor 9e, a columnar conductor 9f, a columnar conductor 9g, a columnar conductor 9h, a columnar conductor 9i, a columnar conductor 9j, a columnar conductors 9k and a columnar conductor 9l are multiple second columnar conductors provided in such a way as to penetrate the multilayer substrate 2 and to surround the columnar conductor portion 7a. Each of the columnar conductors 9a, 9b, 9c, 9d, 9e, 9f, 9g, 9h, 9i, 9j, 9k and 9l is electrically connected to the ground plane 4a provided for a first main surface of the first substrate 4, the first main surface being opposite to a second main surface of the first substrate 4 facing the third substrate 6, and is electrically connected to the ground plane 5c provided for a first main surface of the second substrate 5, the first main surface being opposite to a second main surface of the second substrate 5 facing the third substrate 6.

A columnar conductor 7b is provide in such a way as to be located concentrically with the columnar conductor 7 in the inner layer of the multilayer substrate 3. A columnar conductor 9aa, a columnar conductor 9ba, a columnar conductor 9ca, a columnar conductor 9da, a columnar conductor 9ea, a columnar conductor 9fa, a columnar conductor 9ha, a columnar conductor 9ia, a columnar conductor 9ja, a columnar conductor 9ka and a columnar conductor 9la, which are shown in FIG. 4, are provided in such a way as to penetrate the multilayer substrate 3 and to surround the columnar conductor 7b. Each of the columnar conductors 9aa, 9ba, 9ca, 9da, 9ea, 9fa, 9ha, 9ia, 9ja, 9ka and 9la is electrically connected to the ground plane 5d on the uppermost surface of the multilayer substrate 3, and is electrically connected to the ground plane 5f on the lowermost surface of the multilayer substrate 3.

A strip line 10 is a transmission line extending from an outer peripheral portion of the multilayer substrate 3 to the inside thereof. One end portion of the strip line 10, the end portion extending toward the inside of the multilayer substrate 3, is electrically connected to the columnar conductor 7b. In addition, the other end portion of the strip line 10 is electrically connected to an amplifier 102 which a high frequency circuit 101 includes.

A solder connection portion 11 and solder connection portions 11a to 11l are used in order to connect the multilayer substrate 2 and the multilayer substrate 3. The solder connection portion 11 is provided inside an opening formed in the ground plane 5d of the multilayer substrate 3 and concentrically with the columnar conductor portion 7a and the columnar conductor 7b. The above-mentioned opening of the ground plane 5d is formed to have a size larger than that of the solder connection portion 11 in such a way that there is no electrical continuity between the ground pattern of the ground plane 5d and the solder connection portion 11. The columnar conductor portion 7a and the columnar conductor 7b are electrically connected by the solder connection portion 11.

The solder connection portion 11a is provided in such a way as to be located concentrically with the columnar conductor 9a and the columnar conductor 9aa on the ground plane 5d of the multilayer substrate 3, and connects the columnar conductor 9a and the columnar conductor 9aa. The solder connection portion 11b is provided in such a way as to be located concentrically with the columnar conductor 9b and the columnar conductor 9ba on the ground plane 5d of the multilayer substrate 3, and connects the columnar conductor 9b and the columnar conductor 9ba. The solder connection portion 11c is provided in such a way as to be located concentrically with the columnar conductor 9c and the columnar conductor 9ca on the ground plane 5d of the multilayer substrate 3, and connects the columnar conductor 9c and the columnar conductor 9ca.

The solder connection portion 11d is provided in such a way as to be located concentrically with the columnar conductor 9d and the columnar conductor 9da on the ground plane 5d of the multilayer substrate 3, and connects the columnar conductor 9d and the columnar conductor 9da. The solder connection portion 11e is provided in such a way as to be located concentrically with the columnar conductor 9e and the columnar conductor 9ea on the ground plane 5d of the multilayer substrate 3, and connects the columnar conductor 9e and the columnar conductor 9ea. The solder connection portion 11f is provided in such a way as to be located concentrically with the columnar conductor 9f and the columnar conductor 9fa on the ground plane 5d of the multilayer substrate 3, and connects the columnar conductor 9f and the columnar conductor 9fa.

The solder connection portion 11g is provided in such a way as to be located concentrically with the columnar conductor 9g on the ground plane 5d of the multilayer substrate 3, and connects the columnar conductor 9g to the ground plane 5d. The solder connection portion 11h is provided in such a way as to be located concentrically with the columnar conductor 9h and the columnar conductor 9ha on the ground plane 5d of the multilayer substrate 3, and connects the columnar conductor 9h and the columnar conductor 9ha. The solder connection portion 11i is provided in such a way as to be located concentrically with the columnar conductor 9i and the columnar conductor 9ia on the ground plane 5d of the multilayer substrate 3, and connects the columnar conductor 9i and the columnar conductor 9ia.

The solder connection portion 11j is provided in such a way as to be located concentrically with the columnar conductor 9j and the columnar conductor 9ja on the ground plane 5d of the multilayer substrate 3, and connects the columnar conductor 9j and the columnar conductor 9ja. The solder connection portion 11k is provided in such a way as to be located concentrically with the columnar conductor 9k and the columnar conductor 9ka on the ground plane 5d of the multilayer substrate 3, and connects the columnar conductor 9k and the columnar conductor 9ka. The solder connection portion 11l is provided in such a way as to be located concentrically with the columnar conductor 9l and the columnar conductor 9la on the ground plane 5d of the multilayer substrate 3, and connects the columnar conductor 9l and the columnar conductor 9la.

A coaxial line 12A includes the columnar conductor 7 and the outer conductor 8 enclosing this columnar conductor 7. In the coaxial line 12A, the columnar conductor 7 functions as an inner conductor. A coaxial line 12B is one in which the columnar conductor portion 7a and the columnar conductor 7b which are connected by the solder connection portion 11 function as an inner conductor, and the columnar conductors 9a and 9aa connected by the solder connection portion 11a, the columnar conductors 9b and 9ba connected by the solder connection portion 11b, the columnar conductors 9c and 9ca connected by the solder connection portion 11c, the columnar conductors 9d and 9da connected by the solder connection portion 11d, the columnar conductors 9e and 9ea connected by the solder connection portion 11e, the columnar conductors 9f and 9fa connected by the solder connection portion 11f, the solder connection portion 11g and the columnar conductor 9g, the columnar conductors 9h and 9ha connected by the solder connection portion 11h, the columnar conductors 9i and 9ia connected by the solder connection portion 11i, the columnar conductors 9j and 9ja connected by the solder connection portion 11j, the columnar conductors 9k and 9ka connected by the solder connection portion 11k, and the columnar conductors 9l and 9la connected by the solder connection portion 11l function as an outer conductor.

A land 41a, a land 41b and a land 41c are multiple first electric conduction pads provided for the first substrate 4, and each of the lands is formed in, for example, a flange shape around the columnar conductor portion 7a. The land 41a is provided on the same plane as the ground plane 4a, the land 41b is provided on the same plane as the ground plane 4b, and the land 41c is provided on the same plane as the ground plane 4c.

Figure 5:
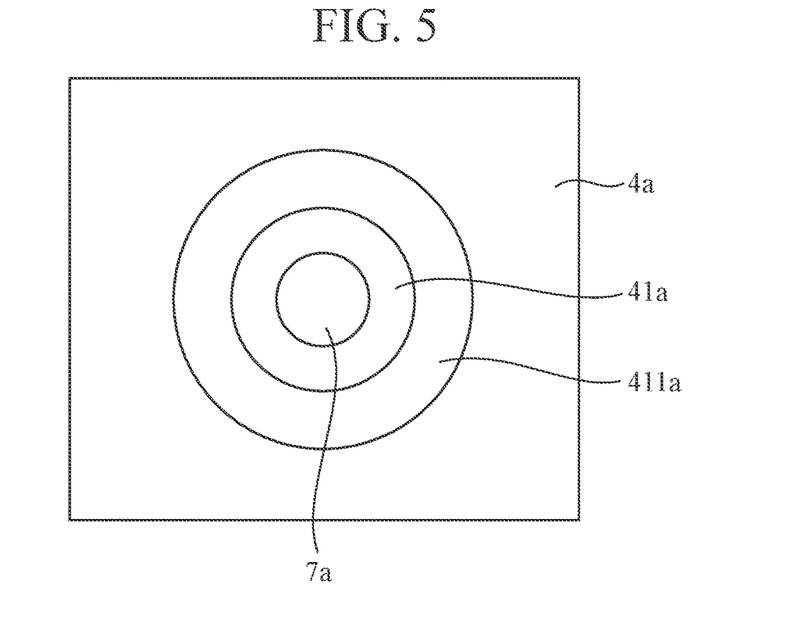
FIG. 5 is a plane view showing a relation between a columnar conductor portion, lands, and a ground plane.

The land 41a is placed inside an opening 411a formed in the ground plane 4a. FIG. 5 is a plane view showing a relation among the columnar conductor portion 7a, the land 41a and the ground plane 4a. As shown in FIG. 5, the land 41a is formed in a flange shape around the columnar conductor portion 7a, and the opening 411a is formed to have a diameter larger than the size of the land 41a. As a result, a clearance is formed between the land 41a and the ground pattern of the ground plane 4a, so that there is no electrical continuity between the ground plane 4a and the land 41a.

The land 41b is placed inside an opening 411b formed in the ground plane 4b. The opening 411b is formed to have a diameter larger than the size of the land 41b in such a way that there is no electrical continuity between the ground plane 4b and the land 41b. The land 41c is placed inside an opening 411c formed in the ground plane 4c. The opening 411c is formed to have a diameter larger than the size of the land 41c in such a way that there is no electrical continuity between the ground plane 4c and the land 41c.

A land 51a, a land 51b and a land 51c are multiple second electric conduction pads provided for the second substrate 5, and each of the lands is formed in, for example, a flange shape around the columnar conductor portion 7a. The land 51a is provided on the same plane as the ground plane 5a, the land 51b is provided on the same plane as the ground plane 5b, and the land 51c is provided on the same plane as the ground plane 5c.

The land 51a is placed inside an opening 511a formed in the ground plane 5a. The opening 511a is formed to have an opening diameter larger than the size of the land 51a in such a way that there is no electrical continuity between the ground plane 5a and the land 51a. The land 51b is placed inside an opening 511b formed in the ground plane 5b. The opening 511b is formed to have an opening diameter larger than the size of the land 51b in such a way that there is no electrical continuity between the ground plane 5b and the land 51b. The land 51c is placed inside an opening 511c formed in the ground plane 5c. The opening 511c is formed to have an opening diameter larger than the size of the land 51c in such a way that there is no electrical continuity between the ground plane 5c and the land 51c.

A land 61a, a land 61b, a land 61c and a land 61d are multiple third electric conduction pads provided for the third substrate 6, and each of the lands is formed in, for example, a flange shape around the columnar conductor portion 7a. The land 61a is provided on the same plane as the ground plane 6a, the land 61b is provided on the same plane as the ground plane 6b, the land 61c is provided on the same plane as the ground plane 6c, and the land 61d is provided on the same plane as the ground plane 6d.

The land 61a is placed inside an opening 611a formed in the ground plane 6a. The opening 611a is formed to have an opening diameter larger than the size of the land 61a in such a way that there is no electrical continuity between the ground plane 6a and the land 61a. The land 61b is placed inside an opening 611b formed in the ground plane 6b. The opening 611b is formed to have an opening diameter larger than the size of the land 61b in such a way that there is no electrical continuity between the ground plane 6b and the land 61b. The land 61c is placed inside an opening 611c formed in the ground plane 6c. The opening 611c is formed to have an opening diameter larger than the size of the land 61c in such a way that there is no electrical continuity between the ground plane 6c and the land 61c. The land 61d is placed inside an opening 611d formed in the ground plane 6d. The opening 611d is formed to have an opening diameter larger than the size of the land 61d in such a way that there is no electrical continuity between the ground plane 6d and the land 61d.

In the coaxial line 12A, the spacing between the center of the columnar conductor 7 which is the inner conductor and the outer conductor 8 is dA. In the coaxial line 12B, the spacing between the columnar conductor portion 7a which is the inner conductor and the columnar conductors 9a to 9l which are the outer conductor is dB, as shown in FIG. 3.

The lands 41a, 41b and 41c function as a capacity formation section (1) which forms a capacitance in the inner layer of the first substrate 4. The lands 51a, 51b, 51c, 51d and 51e, and the solder connection portion 11 function as a capacity formation section (2) which forms a capacitance in the inner layers of the second substrate 5 and the multilayer substrate 3. The lands 61a, 61b, 61c and 61d function as a capacity formation section (3) which forms a capacitance in the inner layer of the third substrate 6.

For the land 41b provided in the inner layer of the first substrate 4, a ground pattern extends to a region in an upper layer, the region corresponding to projection of the land 41b onto the upper layer. In the first substrate 4 shown in FIG. 2, the ground plane 4a, the opening 411a formed in this ground plane, and the land 41a placed inside the opening 411a are provided in the upper layer above the land 41b. The land 41b centered at the columnar conductor portion 7a is formed to have a diameter larger than that of the opening 411a centered at the columnar conductor portion 7a. More specifically, the ground pattern of the ground plane 4a extends to a region corresponding to projection of a region inside the land 41b onto the layer of the ground plane 4a.

Because the ground pattern of the ground plane 4a extends to the upper layer above the land 41b, the capacitance formed between the extending ground pattern and the land 41b is also a part of the capacity formation section (1). The increase in the capacitance of the capacity formation section (1) is useful for the suppression of unnecessary interference between the antenna element 100 connected to the coaxial line 12A and the high frequency filter 1.

Further, the spacing between the first electric conduction pads provided for the first substrate 4 and the third electric conduction pads provided for the third substrate 6 corresponds to the spacing between the capacity formation section (1) and the capacity formation section (3) which are mentioned above. More specifically, the spacing between the lands 41a, 41b and 41c and the lands 61a, 61b, 61c and 61d is d1, as shown in FIG. 3. Further, the spacing between the third electric conduction pads disposed in the third substrate 6 and the second electric conduction pads disposed in the second substrate 5 corresponds to the spacing between the capacity formation section (3) and the capacity formation section (2). More specifically, the spacing between the lands 61a, 61b, 61c and 61d and the lands 51a, 51b and 51c is d2, as shown in FIG. 3.

Figure 6:
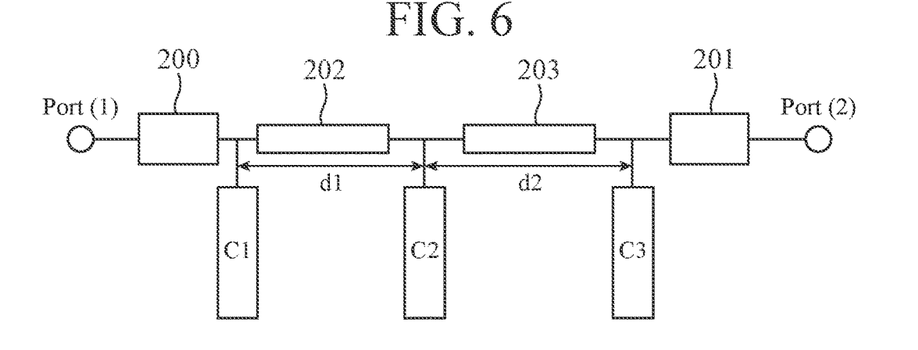
FIG. 6 is an explanatory drawing showing the equivalent circuit of the high frequency filter according to Embodiment 1.

FIG. 6 is an explanatory drawing showing an equivalent circuit of the high frequency filter 1. In FIG. 6, a connection portion 200 connected to a port (1) corresponds to the coaxial line 12A shown in FIG. 3, and a connection portion 201 connected to a port (2) corresponds to the strip line 10. A coupled line 202 and a coupled line 203 correspond to the coaxial line 12B. A capacitance C1 corresponds to the capacity formation section (1), a capacitance C2 corresponds to the capacity formation section (3), and a capacitance C3 corresponds to the capacity formation section (2).

The electrical length of the coupled line 202 is 90 degrees or less at the center frequency (cutoff frequency) of the stopband where the transmission of signals is rejected in the high frequency filter 1, and is d1 shown in FIG. 3. The electrical length of the coupled line 203 is 90 degrees or less at the cutoff frequency, like that of the coupled line 202, and is d2 shown in FIG. 3. The characteristic impedance of the coupled line 202 and the characteristic impedance of the coupled line 203 are determined by the spacing dB shown in FIG. 3.

Figure 7:
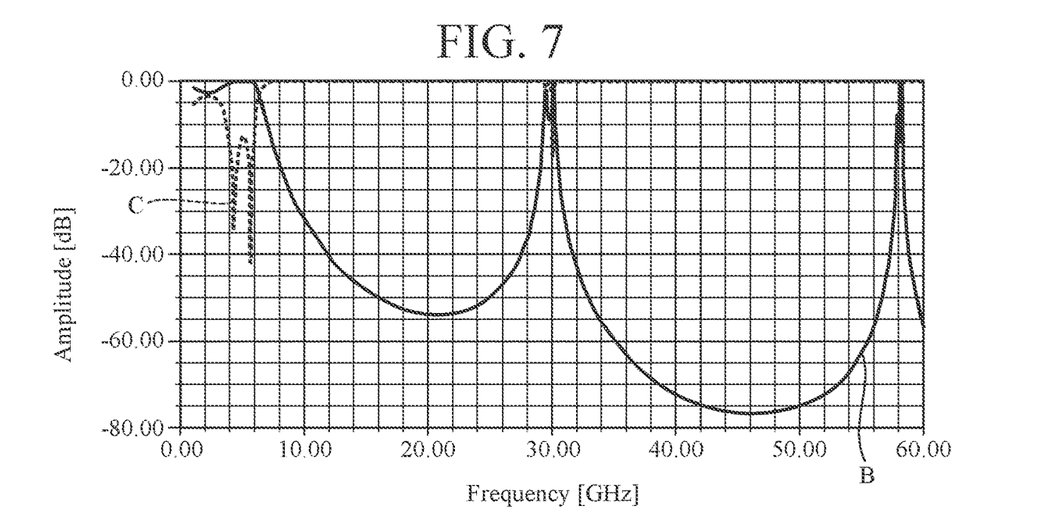
FIG. 7 is a characteristic diagram showing a result (1) of calculating the pass characteristic and the reflection characteristic of the high frequency filter by means of a circuit synthesis calculation.

FIG. 7 is a characteristic diagram showing a result (1) of calculating the pass characteristic B and the reflection characteristic C of the high frequency filter 1 by means of a circuit synthesis calculation. In the circuit synthesis calculation in FIG. 7, the capacitances C1, C2 and C3 in the equivalent circuit shown in FIG. 6 are set to 1.2 (pF), 2.6 (pF) and 1.2 (pF) respectively. The characteristic impedance of each of the coupled lines 202 and 203 is set to 67 ($\Omega$), and the electrical lengths d1 and d2 of the coupled lines 202 and 203 are each set to 30.2 degrees at 6 (GHz) which is the cutoff frequency. The characteristic impedance of each of the connection portions 200 and 201 is set to 50 ($\Omega$). The pass characteristic B is an S21 characteristic, and the reflection characteristic C is an S11 characteristic.

Figure 8:
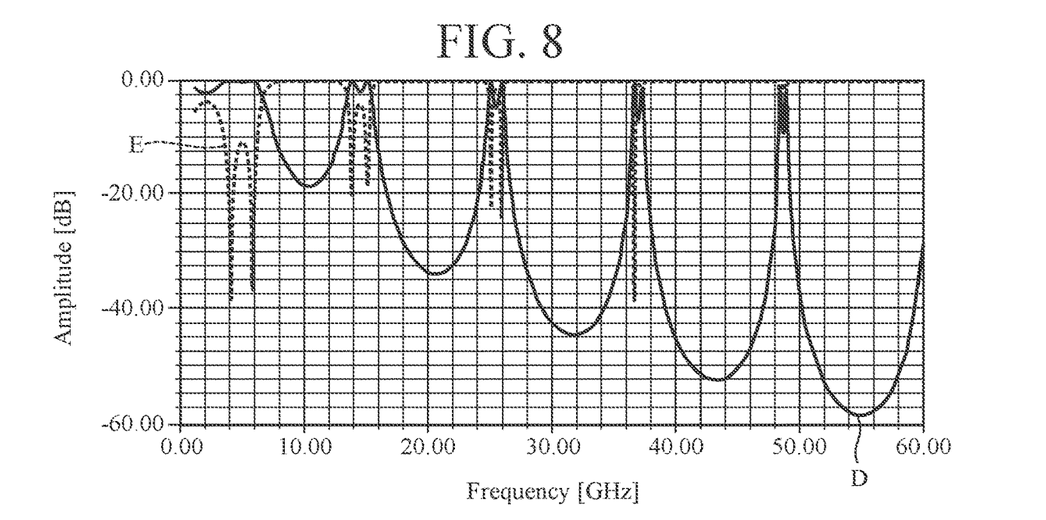
FIG. 8 is a characteristic diagram showing a result (2) of calculating the pass characteristic and the reflection characteristic of the high frequency filter by means of a circuit synthesis calculation.

The parameter values which are the capacitance values, the characteristic impedances and the electrical lengths shown in FIG. 6 are first determined, on the basis of the circuit configuration of a low pass filter which employs a J inverter in which each of the electrical lengths d1 and d2 is 90 degrees. FIG. 8 is a characteristic diagram showing a result (2) of calculating the pass characteristic D and the reflection characteristic E of the high frequency filter 1 by means of a circuit synthesis calculation. In the circuit synthesis calculation in FIG. 8, the capacitances C1, C2 and C3 are set to 0.727 (pF), 1.455 (pF) and 0.727 (pF) respectively. The characteristic impedance of each of the coupled lines 202 and 203 is set to 32 (Ω), and the electrical lengths d1 and d2 of the coupled lines 202 and 203 are each set to 90 degrees at 6 (GHz) which is the cutoff frequency. The characteristic impedance of each of the connection portions 200 and 201 is set to 50 (Ω). The pass characteristic D is an S21 characteristic, and the reflection characteristic E is an S11 characteristic.

As shown by the pass characteristic D of FIG. 8, by setting each of the electrical lengths d1 and d2 to 90 degrees, a stopband is formed in the vicinity of 10 (GHz) which is the second harmonic with respect to 5 (GHz) which is the passing frequency. More specifically, the high frequency filter 1 can form a stopband in the frequency band of unnecessary harmonic components.

There is a case in which a characteristic of suppressing all harmonic components which can occur, up to approximately the fourth harmonic with respect to the pass band, is demanded of higher harmonic wave suppression filters used in high frequency circuits. In contrast with this, in the pass characteristic D, because pass bands are located in the vicinity of 15 (GHz) and in the vicinity of 25 (GHz), the higher harmonic of 15 (GHz) which is the third harmonic is not suppressed.

Figure 9:
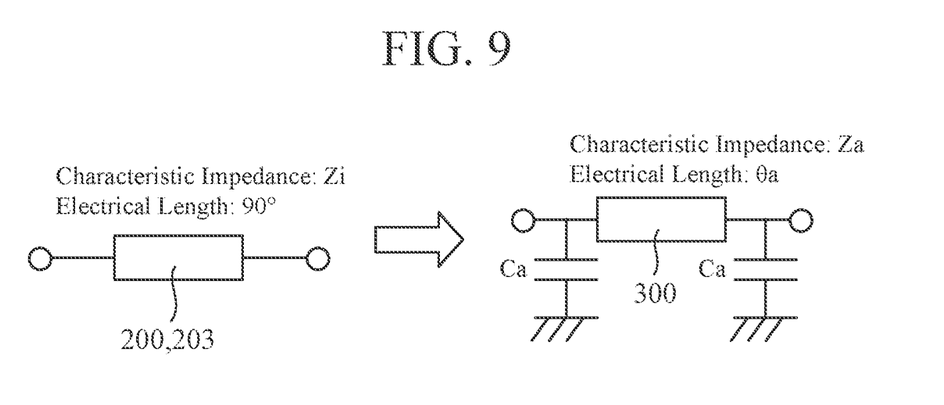
FIG. 9 is an explanatory drawing showing a process of converting electrical lengths.

It is well known well that in the case where the electrical length of a path through which a signal is transmitted is substantially 90 degrees, a frequency band which is substantially an odd multiple is a pass band. Therefore, in order for the high frequency filter 1 to suppress the transmission of all harmonic components which can occur, up to approximately the fourth harmonic with respect to the pass band, it is necessary to set each of the electrical lengths d1 and d2 to substantially 30 degrees. FIG. 9 is an explanatory drawing showing a process of converting the electrical lengths. In the case where each of the characteristic impedances of the coupled lines 202 and 203 shown in FIG. 6 is $Z_1$ and each of the electrical lengths thereof is 90 degrees, the coupled lines 202 and 203 are expressed by a circuit including a line 300, as shown on a right side of FIG. 9. The line 300 is connected to capacitances $C_a$ at respective both ends thereof, and has a characteristic impedance $Z_a$ and an electrical length $\theta_a$. The equivalence of an F matrix corresponding to a circuit on a left side of FIG. 9 and the circuit on the right side of FIG. 9 makes it possible to convert the electrical length $\theta_a$ to substantially 30 degrees in accordance with the following expressions (1) and (2). Here, ω is the angular frequency of the signal.

$$Z_1 = Z_a \times \sin \theta_a \tag{1}$$

$$1 = Z_a \times C_a \times \omega \tag{2}$$

A result of determining capacitance and a characteristic impedance by converting each of the electrical lengths d1 and d2 to substantially 30 degrees in accordance with the above-mentioned expressions (1) and (2) is the result (1) shown in FIG. 7. In the case of setting each of the electrical lengths d1 and d2 to substantially 30 degrees, when the high frequency filter 1 has a pass band in the vicinity of 5 (GHz), no other pass band does not occur in a band of frequencies being higher than the pass band and reaching up to substantially 30 (GHz), as shown by the pass characteristic B, so that the transmission of all harmonic components which can occur, up to approximately the fourth harmonic with respect to the pass band, is suppressed.

Figure 10:
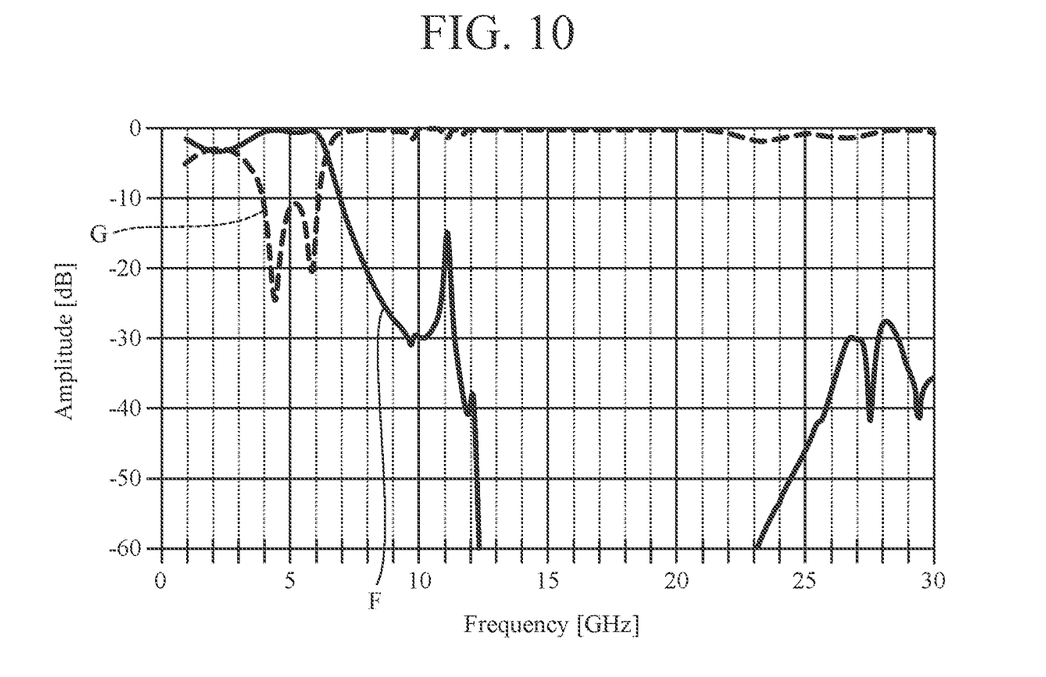
FIG. 10 is a characteristic diagram showing a result (1) of calculating the pass characteristic and the reflection characteristic of the high frequency filter by means of an electromagnetic field analysis.
Figure 11A:
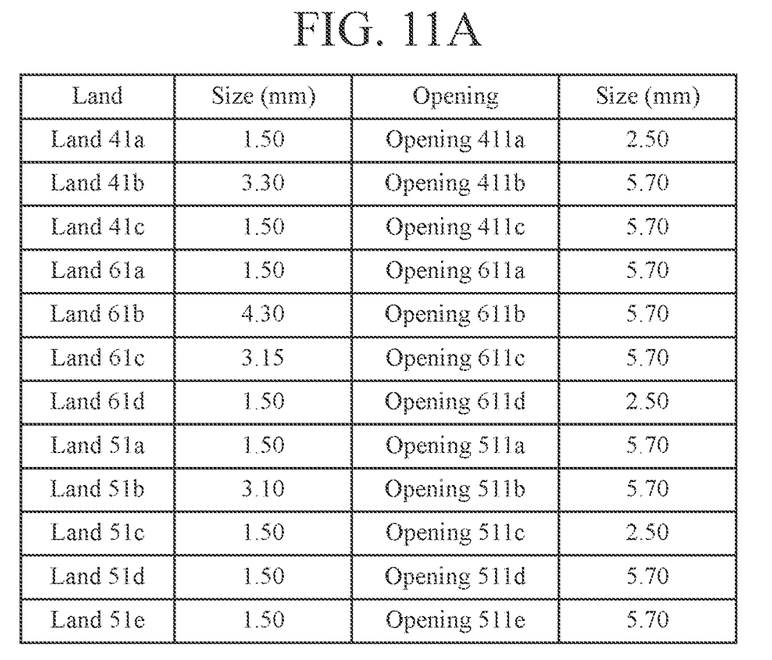
FIG. 11A is a table showing the sizes of lands and openings.
Figure 11B:
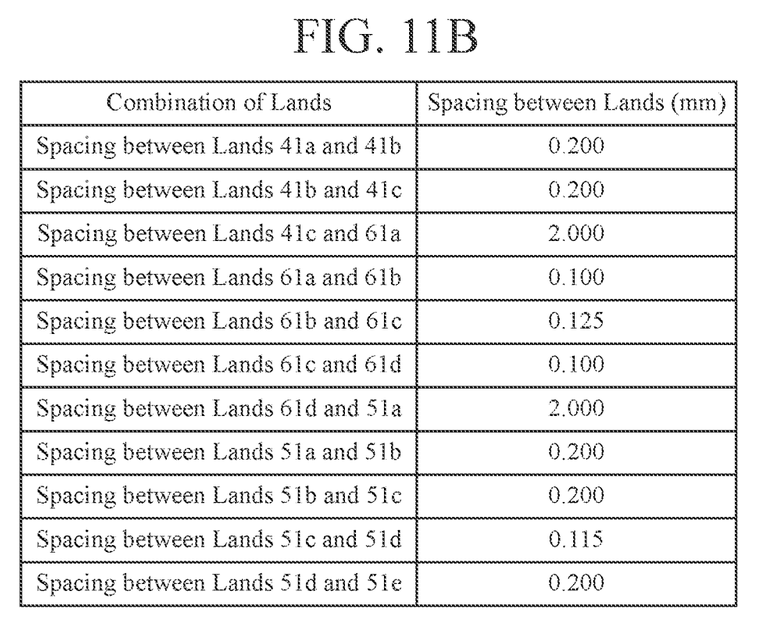
FIG. 11B is a table showing the spacing between lands in different layers.

FIG. 10 is a characteristic diagram showing a result (1) of calculating the pass characteristic F and the reflection characteristic G of the high frequency filter 1 by means of an electromagnetic field analysis. Further, FIG. 11A is a table showing the sizes of the lands and the openings, and FIG. 11B is a table showing the spacings between the lands in different layers. The electromagnetic field analysis result (1) shown in FIG. 10 is calculated by defining the configuration of the high frequency filter 1 as follows. The sizes of the lands and openings of the high frequency filter 1 are determined to be values (in millimeters) described in the table (1) shown in FIG. 11A and the spacings between the lands are determined to be values (in millimeters) described in the table (2) shown in FIG. 11B in such a way that the capacitances C1, C2 and C3 shown in FIG. 6 are set, respectively, to 1.2 (pF), 2.6 (pF) and 1.2 (pF), each of the characteristic impedances Z of the connection portions 200 and 201 is 50 (Ω), each of the characteristic impedances Z of the coupled lines 202 and 203 is 67 (Ω), and each of the electrical lengths of these coupled lines is substantially 30 degrees at 6 (GHz) which is the cutoff frequency. The spacing dB between the inner conductor and the outer conductor which constitute the coaxial line 12B can be calculated in accordance with the following expression (3). For example, in the case where the diameter D of the columnar conductor 7 is 1 (mm), dB is 8.8 (mm). Here, $\varepsilon_r$ is the dielectric constant of the dielectric substrate which constitutes the multilayer substrate 2.

$$dB = D \times 10^{\sqrt{\frac{\varepsilon_r}{138}} * z} \tag{3}$$

In the pass characteristic B, a stopband extending from the region in the vicinity of 5 (GHz) which is the pass band to substantially 30 (GHz) is formed, on the other hand, even in the case where each of the electrical lengths d1 and d2 is similarly set to substantially 30 degrees, a pass band can occur in the vicinity of a band in which the second harmonic with respect to 5 (GHz) is included, as shown in the pass characteristic F. Thus, the pass characteristic F is the result different from the circuit synthesis calculation result (1) shown in FIG. 7. This is because the spacing dB is 8.8 (mm) and hence is too wide for the rejection of the transmission of higher harmonics, so that harmonic components are transmitted. Therefore, it is necessary to determine the spacing dB by means of a simulation calculation in such a way that a stopband is formed in all frequency bands in which harmonic components up to a desired-order (e.g., fourth-order) harmonic can occur.

Figure 12:
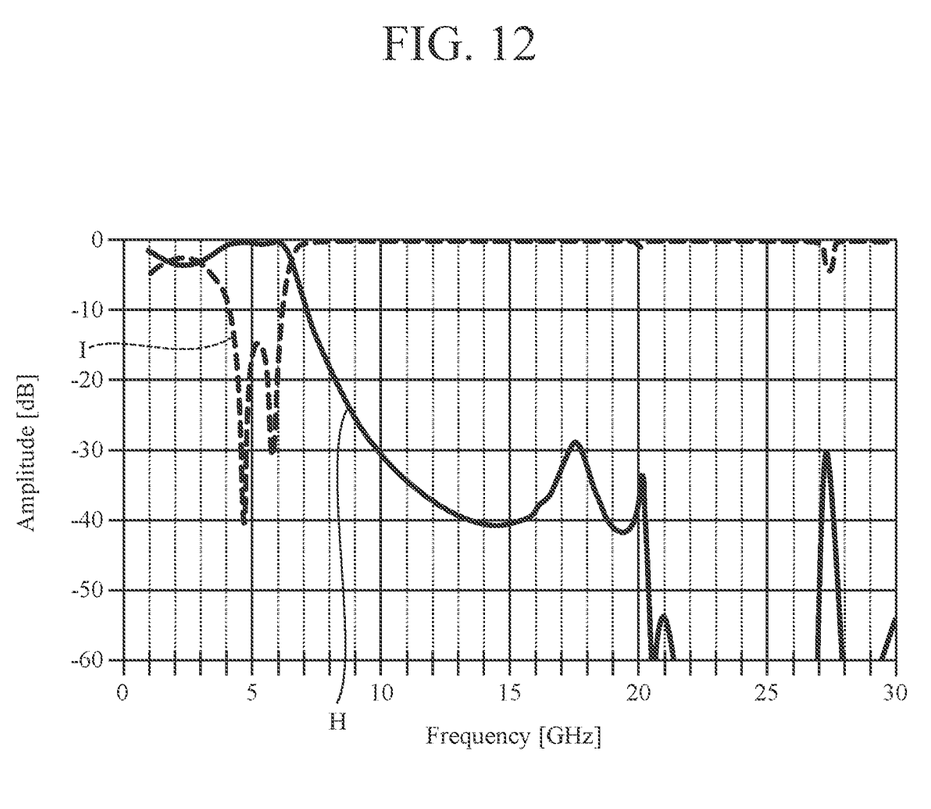
FIG. 12 is a characteristic diagram showing a result (2) of calculating the pass characteristic and the reflection characteristic of the high frequency filter by means of an electromagnetic field analysis.

FIG. 12 is a characteristic diagram showing a result (2) of calculating the pass characteristic H and the reflection characteristic I of the high frequency filter 1 by manes of an electromagnetic field analysis. The electromagnetic field analysis result (2) shown in FIG. 12 is calculated by defining the configuration of the high frequency filter 1 as follows. The sizes of the lands and openings of the high frequency filter 1 are determined to be values described in the table (1) and the spacings between the lands are determined to be values described in the table (2) in such a way that the capacitances C1, C2 and C3 shown in FIG. 6 are set, respectively, to 1.2 (pF), 2.6 (pF) and 1.2 (pF), each of the characteristic impedances Z of the connection portions 200 and 201 is 50 (Ω), each of the characteristic impedances Z of the coupled lines 202 and 203 is 67 (Ω), and each of the electrical lengths of these coupled lines is substantially 30 degrees at 6 (GHz) which is the cutoff frequency.

Further, the spacing dB between the inner conductor and the outer conductor which constitute the coaxial line 12B is set to 7.2 (mm) by means of a simulation calculation in such a way that all frequency bands in which harmonic components approximately the fourth harmonic with respect to the pass band can occur are stopbands. As a result, in the pass characteristic H shown in FIG. 12, a stopband is formed in a band which is in the vicinity of the second harmonic and which occurs in the pass characteristic F shown in FIG. 10, so that the transmission of the second harmonic is also suppressed.

As mentioned above, in the high frequency filter 1 according to Embodiment 1, the multilayer substrate 2 includes: the first substrate 4 where the lands 41a, 41b and 41c are provided; the second substrate 5 where the lands 51a to 51c are provided; and the third substrate 6 where the lands 61a to 61d are provided and which is sandwiched between the first substrate 4 and the second substrate 5, and, in the multilayer substrate 2, the columnar conductor 7 electrically connected to the lands 41a to 41c, 51a to 51c and 61a to 61d, and the columnar conductors 9a to 9l provided in such a way as to surround the columnar conductor 7, electrically connected to the ground plane 4a of the first substrate 4, and electrically connected to the ground plane 5c of the second substrate 5 are included. The spacing d1 between the lands 41a to 41c and the lands 61a to 61d and the spacing d2 between the lands 51a to 51c and the lands 61a to 61d are electrical lengths of 90 degrees or less at the cutoff frequency. As a result, a stopband is formed in a frequency band in which an integral-order harmonic with respect to the passing frequency in the high frequency filter 1 can occur.

In the high frequency filter 1 according to Embodiment 1, the spacing d1 between the lands 41a to 41c and the lands 61a to 61d and the spacing d2 between the lands 51a to 51c and the lands 61a to 61d are electrical lengths of 30 degrees at the cutoff frequency, and the spacing dB between the columnar conductor 7 and the columnar conductors 9a to 9l is determined by means of a simulation calculation in such a way that the transmission of a desired-order harmonic component with respect to the passing frequency is rejected. As a result, the high frequency filter 1 makes it possible to form a stopband in all frequency bands in which unnecessary harmonic components can occur.

Embodiment 2

Although the high frequency filter 1 according to Embodiment 1 includes the multilayer substrate 2 and the multilayer substrate 3 which are connected to each other by the solder connection portions, a high frequency filter according to Embodiment 2 includes a single multilayer substrate without employing a solder connection portion.

Figure 13:
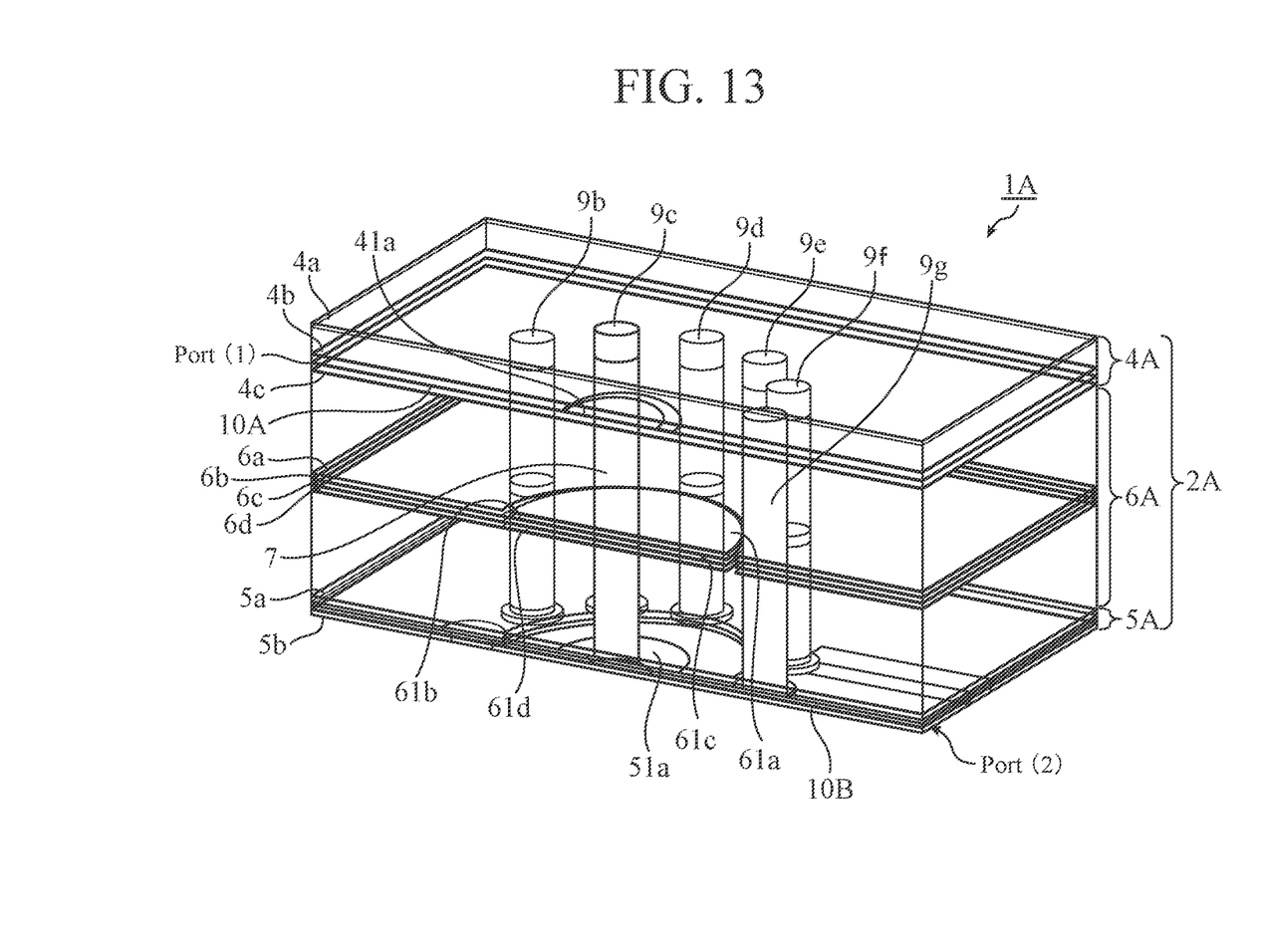
FIG. 13 is a cross-sectional perspective view showing a high frequency filter according to Embodiment 2.

FIG. 13 is a cross-sectional perspective view showing the high frequency filter 1A according to Embodiment 2. In FIG. 13, a high frequency filter 1A includes a multilayer substrate 2A. The multilayer substrate 2A is a multilayered dielectric substrate including a first substrate 4A, a second substrate 5A and a third substrate 6A. In the first substrate 4A, a ground plane 4a is provided for an uppermost surface, a ground plane 4b is provided for an inner layer, and a ground plane 4c is provided for a lowermost surface. In the second substrate 5A, a ground plane 5a is provided for an uppermost surface, a ground plane 5b is provided for an inner layer, and a ground plane 5c is provided for a lowermost surface. The third substrate 6A is sandwiched between the first substrate 4A and the second substrate 5A, and, in its inner layer, a ground plane 6a, a ground plane 6b, a ground plane 6c and a ground plane 6d are provided in order along a direction from an upper layer toward a lower layer.

A columnar conductor 7 is a first columnar conductor provided in such a way as to penetrate an inner layer of the multilayer substrate 2A. A columnar conductor 9a, a columnar conductor 9b, a columnar conductor 9c, a columnar conductor 9d, a columnar conductor 9e, a columnar conductor 9f, a columnar conductor 9g, a columnar conductor 9h, a columnar conductor 9i, a columnar conductor 9j, a columnar conductor 9k and a columnar conductor 9l are multiple second columnar conductors provided in such a way as to penetrate the inner layer of the multilayer substrate 2A and to surround the columnar conductor 7. Because FIG. 13 shows a cross section of the high frequency filter 1A, the illustration of the columnar conductors 9a, 9h, 9i, 9j, 9k and 9l which are provided in one portion cut from the high frequency filter 1A is omitted.

A strip line 10A is a transmission line extending from an outer peripheral portion of the first substrate 4A to the inside thereof. One end portion of the strip line 10A extending inside the first substrate 4A is electrically connected to the columnar conductor 7. In addition, the other end portion of the strip line 10A is a port (1) electrically connected to an antenna element 100 shown in FIG. 3.

A strip line 10B is a transmission line extending inside from an outer peripheral portion of the second substrate 5A. One end portion of the strip line 10B extending inside the second substrate 5A is electrically connected to the columnar conductor 7. In addition, the other end portion of the strip line 10B is a port (2) electrically connected to an amplifier 102 which a high frequency circuit 101 shown in FIG. 3 includes.

A land 41a is a first electric conduction pad provided for the first substrate 4A, and is formed in, for example, a flange shape around the columnar conductor 7. The land 41a is provided on the same plane as the ground plane 4b. A land 51a is a second electric conduction pad provided for the second substrate 5A, and is formed in, for example, a flange shape around the columnar conductor 7. The land 51a is disposed on the same plane as the ground plane 5a.

A land 61a, a land 61b, a land 61c and a land 61d are multiple third electric conduction pads provided for the third substrate 6A, and each of the lands is formed in, for example, a flange shape around the columnar conductor 7. The land 61a is provided on the same plane as the ground plane 6a, the land 61b is provided on the same plane as the ground plane 6b, the land 61c is provided on the same plane as the ground plane 6c, and the land 61d is provided on the same plane as the ground plane 6d.

In the high frequency filter 1A, the connection portion 200 shown in FIG. 6 corresponds to the strip line 10A, and the connection portion 201 corresponds to the strip line 10B. The coupled lines 202 and 203 correspond to a coaxial line in which the columnar conductor 7 functions as an inner conductor and the columnar conductors 9a to 9l surrounding the columnar conductor 7 function as an outer conductor. In this coaxial line, the spacing between the columnar conductor 7 which is the inner conductor, and the columnar conductors 9a to 9l which are the outer conductor is dB shown in FIG. 3.

The land 41a functions as a capacity formation section (1) which forms a capacitance in the inner layer of the first substrate 4A. The land 51a functions as a capacity formation section (2) which forms a capacitance in the inner layer of the second substrate 5A. The lands 61a, 61b, 61c and 61d function as a capacity formation section (3) which forms a capacitance in the inner layer of the third substrate 6A.

The spacing between the first electric conduction pad provided for the first substrate 4A and the third electric conduction pads provided for the third substrate 6A corresponds to the spacing between the capacity formation section (1) and the capacity formation section (3). More specifically, the spacing between the land 41a and the lands 61a, 61b, 61c and 61d is d1 shown in FIG. 3. Further, the spacing between the third electric conduction pads provided for the third substrate 6A and the second electric conduction pad provided for the second substrate 5A corresponds to the spacing between the capacity formation section (3) and the capacity formation section (2). More specifically, the spacing between the lands 61a, 61b, 61c and 61d, and the lands 51a, 51b and 51c is d2 shown in FIG. 3.

As mentioned above, in the high frequency filter 1A according to Embodiment 2, the spacing d1 between the land 41a and the lands 61a to 61d and the spacing d2 between the land 51a and the lands 61a to 61d are electrical lengths of 30 degrees or less at the cutoff frequency, and the spacing dB between the columnar conductor 7 and the columnar conductors 9a to 9l is one to reject a target harmonic component. Because the spacing dB is the one to reject the transmission of the target harmonic component, the high frequency filter 1A makes it possible to form a stopband in the frequency band of unnecessary harmonic components.

It is to be understood that a combination of the embodiments can be made, various changes can be made in an arbitrary component in each of the embodiments, or an arbitrary component in each of the embodiments can be omitted.

INDUSTRIAL APPLICABILITY

The high frequency filter according to the present disclosure can be used in, for example, thin antennas mounted in movable bodies.

REFERENCE SIGNS LIST

1, 1A high frequency filter, 2, 2A, 3 multilayer substrate, 4, 4A first substrate, 4a to 4c, 5a to 5f, 6a to 6d ground plane, 5, 5A second substrate, 6, 6A third substrate, 7, 7b, 9a to 9l, 9aa to 9fa, 9ha to 9la columnar conductor, 7a columnar conductor portion, 8 outer conductor, 10, 10A, 10B strip line, 11, 11a to 11l solder connection portion, 12A, 12B coaxial line, 41a to 41c, 51a to 51d, 61a to 61d land, 100 antenna element, 101 high frequency circuit, 102 amplifier, 200, 201 connection portion, 202, 203 coupled line, 300 line, and 411a to 411c, 511a to 511c, 611a to 611d opening.

The invention claimed is:

1. A high frequency filter comprising:
a multilayer substrate including a first multilayered substrate for which a first electric conduction pad including multiple lands formed along a layering direction of the multilayer substrate is provided, the multiple lands forming a capacitance, a second multilayered substrate for which a second electric conduction pad including multiple lands formed along the layering direction is provided, the multiple lands forming a capacitance, and a third multilayered substrate for which a third electric conduction pad including multiple lands formed along the layering direction is provided, the multiple lands forming a capacitance, the third substrate being sandwiched between the first substrate and the second substrate;
a first columnar conductor provided in such a way as to penetrate the multilayer substrate, and electrically connected to the first electric conduction pad, the second electric conduction pad and the third electric conduction pad, a signal being input to and output from the first columnar conductor via both ends of the multilayer substrate in the layering direction; and
multiple second columnar conductors provided in such a way as to penetrate the multilayer substrate and to surround the first columnar conductor, electrically connected to a ground plane provided on a first main surface of the first substrate, the first main surface being opposite to a second main surface facing the third substrate, and electrically connected to a ground plane provided on a first main surface of the second substrate, the first main surface being opposite to a second main surface facing the third substrate,
wherein the first columnar conductor and the second columnar conductors constitute a coaxial line in which the first columnar conductor functions as an inner conductor and the second columnar conductors function as an outer conductor, and
in the first columnar conductor, a portion corresponding to a spacing between the first electric conduction pad and the third electric conduction pad and a portion corresponding to a spacing between the second electric conduction pad and the third electric conduction pad are electrical lengths of 90 degrees or less at a center frequency of a stopband where transmission of a signal is rejected.

2. The high frequency filter according to claim 1, wherein in the first columnar conductor, the portion corresponding to the spacing between the first electric conduction pad and the third electric conduction pad and the portion corresponding to the spacing between the second electric conduction pad and the third electric conduction pad are electrical lengths of 30 degrees at the center frequency of the stopband, and
a spacing between the first columnar conductor and the second columnar conductors is determined by means of a simulation calculation in such a way that transmission of a desired-order harmonic component with respect to a passing frequency is rejected.

3. The high frequency filter according to claim 1, wherein the coaxial line has a characteristic impedance which is adjusted on a basis of both a diameter of the first columnar conductor and a spacing between the first columnar conductor and the second columnar conductors.

4. The high frequency filter according to claim 1, wherein the first electric conduction pad is electrically connected to an antenna element.

5. The high frequency filter according to claim 1, wherein the second electric conduction pad is electrically connected to an amplifier which a high frequency circuit includes.

6. The high frequency filter according to claim 1, wherein n is a value which is a result of dividing a value acquired by multiplying a square root of a dielectric constant of the third substrate by a characteristic impedance of the coaxial line by 138, and
a spacing between the first columnar conductor and the second columnar conductors is equal to or less than a value which is a result of multiplying a diameter of the first columnar conductor by n-th power of 10.

7. The high frequency filter according to claim 1, wherein for the first electric conduction pad which is provided for an inner layer of the first substrate, a ground pattern of the ground plane of the first substrate extends to a region in an upper layer of the first substrate, the region corresponding to projection of the first electric conduction pad onto the upper layer, a capacitance is formed between the ground pattern and the first electric conduction pad, and a capacitance is formed between the first electric conduction pad and a ground pattern formed on a same layer as the inner layer of the first substrate.

\* \* \* \* \*